(12) United States Patent
Oh et al.

(10) Patent No.: US 7,501,879 B1
(45) Date of Patent: Mar. 10, 2009

(54) EFUSE RESISTANCE SENSING SCHEME WITH IMPROVED ACCURACY

(75) Inventors: Kwansuhk Oh, San Jose, CA (US);
Raymond C. Pang, San Jose, CA (US);
Hsung Jai Im, Cupertino, CA (US);
Sunhom Paak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 22 days.

(21) Appl. No.: 11/717,836

(22) Filed: Mar. 13, 2007

(51) Int. Cl.
*G11C 17/18* (2006.01)
*H01H 85/00* (2006.01)

(52) U.S. Cl. .................................. 327/525; 365/225.7
(58) Field of Classification Search ......... 327/525–526, 327/50–51; 365/225.7
See application file for complete search history.

(56) References Cited

U.S. PATENT DOCUMENTS

| | | | |
|---|---|---|---|
| 6,008,673 A * | 12/1999 | Glass et al. | 327/77 |
| 6,384,664 B1 | 5/2002 | Hellums et al. | |
| 6,995,601 B2 * | 2/2006 | Huang et al. | 327/525 |
| 7,009,443 B2 * | 3/2006 | Illegems | 327/525 |
| 7,224,633 B1 * | 5/2007 | Hovis et al. | 365/225.7 |
| 7,307,911 B1 * | 12/2007 | Anand et al. | 365/225.7 |

* cited by examiner

*Primary Examiner*—Dinh T. Le
(74) *Attorney, Agent, or Firm*—Thomas A. Ward; Michael R. Hardaway

(57) ABSTRACT

An eFuse sensing circuit replaces the inverters used to provide the "read" output state of a conventional eFuse circuit. The sensing circuit includes a comparator with one input coupled to the eFuse circuitry, and a second input coupled to a reference voltage generator circuit. The reference voltage generator circuit includes an internal resistor. Transistors of the sense circuit are provided to mimic the transistors of the eFuse circuit, so that variations of transistors due to process, voltage and temperature will be substantially the same. The resistor of the sense circuit is then effectively compared with the resistance of the eFuse by the comparator irrespective of temperature and process variations.

14 Claims, 4 Drawing Sheets

EFUSE RESISTANCE SENSING SCHEME WITH IMPROVED ACCURACY

FIELD OF THE INVENTION

The present invention relates to circuitry for reading the program state of eFuse circuits.

BACKGROUND

FIG. 1 illustrates the components of a typical eFuse cell. The "eFuse" or fuse 2 in the cell does not act as a typical fuse does by breaking the circuit if it carries too much current. Instead, the eFuse is made with poly-silicon or a similar type of material where the resistance of the fuse can change by allowing a certain amount of current to flow. A high current on the Vfs ("fuse voltage") pad 16 will increase the resistance of the eFuse 2 from a low of about 300 Ohms to a high of about 1 Mega Ohm.

In addition to the eFuse 2, the eFuse cell of FIG. 1 includes thick oxide transistors 4, 6 and 8, capable of having high voltages across their terminals. The thick oxide is illustrated by the "x" pattern drawn on the gate. Further, a PMOS transistor 10 and inverters 12 and 14 are formed with thin oxide devices, which operate at a lower, typical "core" or system voltage (e.g., 1.0v). The PMOS transistor 10 is illustrated by a gate circle, while NMOS devices 4, 6 and 8 have no gate circle. The Vfs pad 16 is a voltage supply pad shared by all fuses within an array of eFuse cells. The "fs" of "Vfs" stands for fuse to source voltage.

When programming the eFuse cell of FIG. 1, "Read" is held to a logic low or 0, and "Program," is a logic high or 1. A high programming voltage, for example either 3.3 volts or 2.5 volts, is further applied to "Vfs." Because "Read" is low and "Pgm" is high, transistors 4 and 8 are then turned off and transistor 6 is on. Current from "Vfs" flows through the node n2, "fuse," node n1, and transistor 6 to ground. The current created, for example about 10 milliamps, changes the resistance of the fuse 2 from a low of about 300 Ohms to a high of about 1 Mega Ohm. (The main purpose of transistor 8 is to isolate, and therefore protect thin oxide devices from any high voltages on the programming path.)

During reading, "Read" is a logic 1 and "Pgm" is a logic 0. No voltage is supplied on the Vfs pad 16. Thus, transistor 6 is turned off, and transistors 4 and 8 are on. Because the gate of transistor 10 is low, shown as ground, transistor 10 is also on. Thus, transistors 10, 8 and 4 and the fuse 2 in effect form a voltage divider whose output is node n3. Typically, transistors 4 and 8 are designed to be sufficiently strong and have a low impedance so that they do not have an effect on the voltage at node n3, leaving the eFuse device to control the voltage on node n3.

Thus, the voltage on node n3 is a function of transistor 10 and the resistance of eFuse 2 only. For FIG. 1, when the "fuse" is un-programmed, having a low resistance of about 300 ohms, node n3 is at a relatively low voltage, referenced as n3_min. When the eFuse 2 is programmed, having a high resistance, node n3 is at a relatively high voltage, referenced as n3_max. Voltages n3_max and n3_min are between Vdd and ground. Inverter 12 is designed to have a trip point somewhere between n3_min and n3_max so that it, along with inverter 14, can resolve the node n3 voltage to logic 0 or 1 on the output, Data. For example, Data will be a logic 0 if the node n3 voltage is at n3_min for an unprogrammed eFuse because n3_min is less than the inverter 12 trip point.

The 12 inverter trip point varies with process, voltage, and temperature (PVT). The n3_min to n3_max range also varies with PVT, as well as the difference between the un-programmed and programmed resistances of eFuse 2. A disadvantage with having inverter 12 sense the n3 node voltage is that its trip point varies independently of the n3_min to n3_max variation. For example, under some PVT condition it is possible for the n3_min to n3_max range to shift up while the trip point of inverter 12 shifts down. If the trip point shifts below the n3 voltage range, the Data output will always have a logic 1, regardless of the resistance of eFuse 2. It would be desirable to accurately sense the state of the eFuse by having the sensing trip point track the n3 node voltage variations across process, voltage and temperature.

SUMMARY

Embodiments of the present invention provide a circuit and process for sensing the state of the fuse in a reliable fashion irrespective of variations in process, voltage and temperature (PVT).

The eFuse sensing circuit according to embodiment of the present invention replaces the inverters of the conventional eFuse circuit. The sensing circuit includes a comparator with one input coupled to the eFuse circuitry, and a second input coupled to a reference voltage generator circuit. The reference voltage generator circuit includes an internal resistor. Transistors of the reference circuit are provided to mimic the transistors of the eFuse circuit, so that variations of transistors due to process, voltage and temperature will be substantially the same. The resistor of the reference circuit is then effectively compared with the resistance of the eFuse by the comparator irrespective of temperature and process variations.

Circuitry is further provided in one embodiment for the comparator of the eFuse sensing circuit to provide for more accurate sensing. The comparator circuit includes cross coupled inverters with power supplied to the cross coupled inverters through transistors receiving an enable signal. The enable signal is applied to power the comparator when a reading of the eFuse state is desired, and the comparator output is latched before the sense enabling signal is removed to power it down.

BRIEF DESCRIPTION OF THE DRAWINGS

Further details of the present invention are explained with the help of the attached drawings in which.

DETAILED DESCRIPTION

Figure 1:
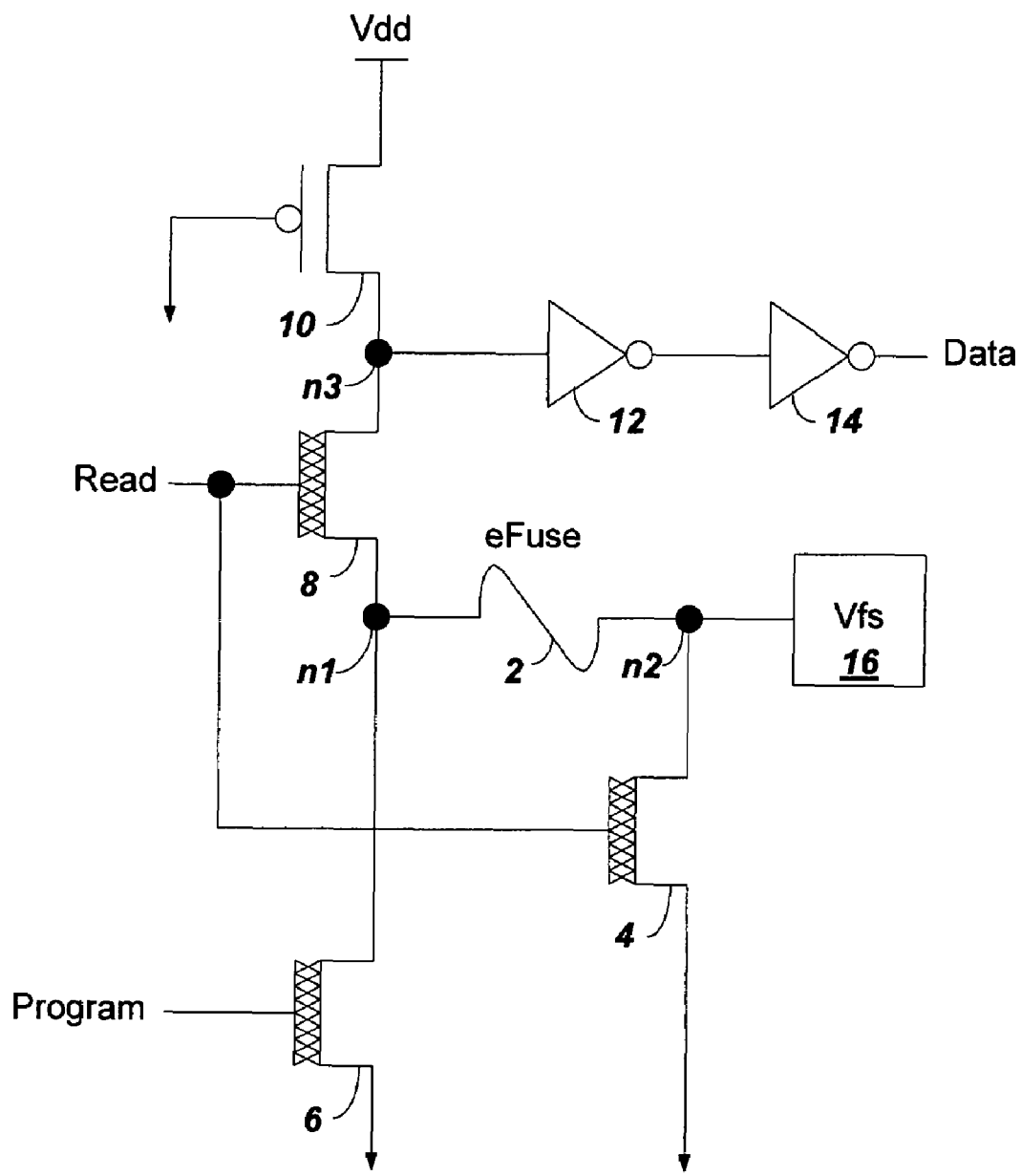
FIG. 1 shows components of a conventional eFuse cell.
Figure 2:
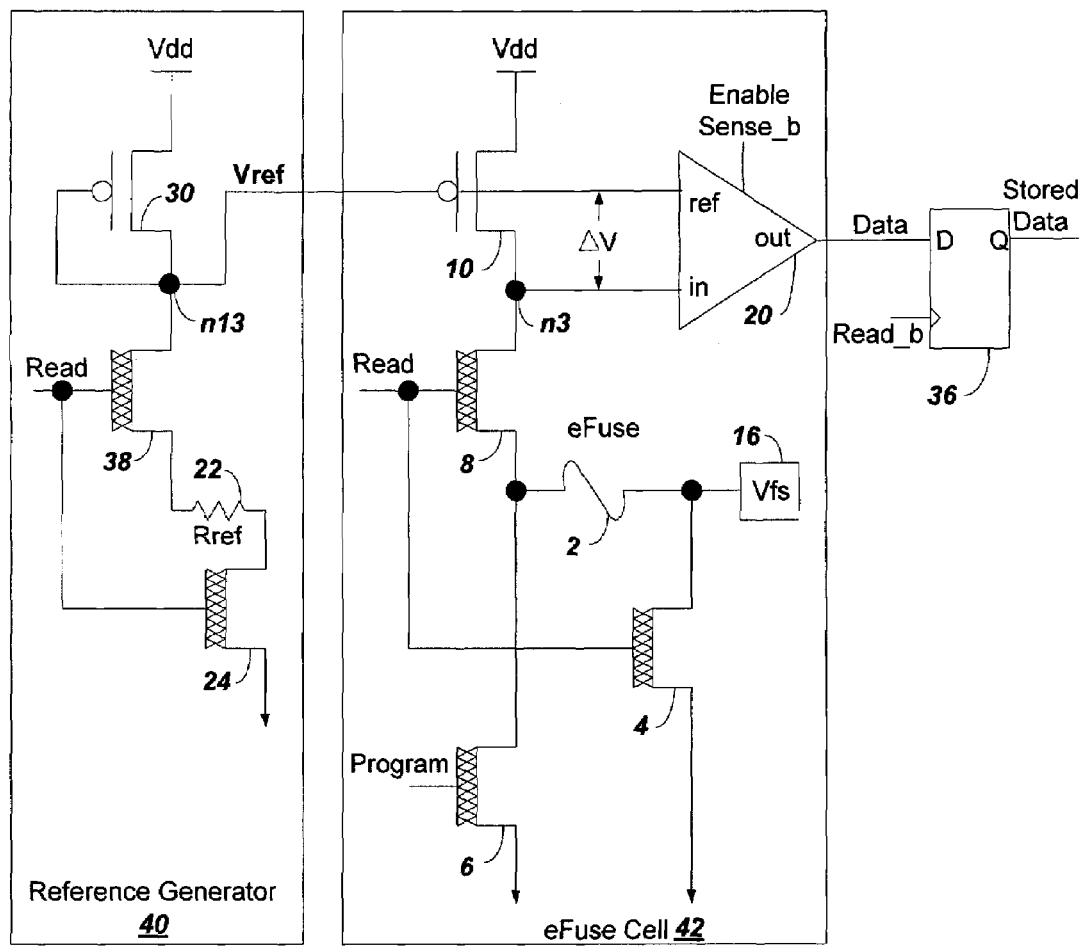
FIG. 2 shows components of an eFuse cell with sensing components according to embodiments of the present invention for reading the eFuse cell.

FIG. 2 shows a block diagram of an eFuse cell with a sensing circuit according to embodiments of the present invention. The comparator 20, which replaces the inverters 12 and 14 of prior circuits, is represented having three inputs and one output. The 'in' input comes from node n3 of the eFuse cell 42, while the reference or 'ref' input comes from a reference voltage Vref generated by reference generator circuit 40, and an enable input 'Enable Sense_b' input when asserted compares the former two inputs. The 'out' output produces the state of the eFuse after the comparison. If the voltage on node n3 is less than the Vref voltage during the comparison, the comparator 20 produces a logic low on the output. Similarly, if the n3 voltage is greater than the Vref voltage during the comparison, a logic high is produced by comparator 20. PMOS transistor 10 in one embodiment is a low Vt device. For convenience, components carried over from FIG. 1 to FIG. 2, as well as components carried over in subsequent drawings, are similarly labeled.

This reference generator circuit 40 mimics the read path of the eFuse cell (transistor 10=transistor 30, transistor 8=transistor 38, and transistor 4=transistor 24) and produces the Vref reference voltage as an output. With transistors in the reference generator 40 and eFuse circuit 42 the same size and made by the same process, the reference resistor 22 in the reference generator circuit 40 determines the output Vref voltage, in the same way the eFuse resistance determines the n3 output voltage. The difference in the resistance of eFuse 2 and resistance Rref of resistor 22 produces a delta voltage $\Delta V$ to the comparator 20. Thus the trip point of the comparator 20 can be expressed as a function of the resistance Rref of resistor 22. If eFuse resistance is less than Rref the sensing circuit will produce a logic 0 because Vn3<Vref, and if the resistance of eFuse 2 is greater than Rref, a logic 1 is produced.

Note that Vref also connects to the gate of transistor 30, so that both transistor 30 and transistor 10 have the same gate voltage. In one embodiment, both transistor 10 and 30 are set to operate in the saturation region of MOS operation. The transistors 10 and 30 are then both low Vt versions of PMOS devices to allow for low Vdd operation, although regular Vt versions are possible. This ensures that the main difference between the reference generator 40 and eFuse cell 42 are the resistances of resistor 22 and eFuse 2, as far as reading the eFuse state is concerned.

Because corresponding transistors of the reference generator circuit 40 and the eFuse cell 42 match, both Vref and the voltage at node n3 vary substantially identically with PVT variations, so that the trip point is solely determined by the resistance Rref. The resistor 22 in one embodiment can be implemented with salicide blocked poly. In another embodiment it can also be diffusion, or a discrete, off-chip resistor. The reference voltage generator 40 in one embodiment is shared between an array of eFuse cells, helping to reduce area requirements.

During read operations, when Read=1, static current is consumed from the Vdd supply because there is a low impedance path between Vdd and ground through either transistors 10, 8 and 4, or transistors 30, 38 and 24. If the data is required to be available for long periods of time, this static current drain would not be desirable. Instead, the data from eFuse cell 2 can be read for a short period of time, and the flip-flop 36 can be used to latch and store the data. Once the eFuse cell is read, the power supply can be disabled to components of the eFuse cell 42 and reference generator circuit 40 to prevent a power drain. The signal Enable Sense_b signal applied to the comparator 20 provides a power supply disabling signal between reads of the eFuse cell. The signal Read_b applied to the flip-flop 36 similarly allows for reading of he eFuse cell state only when the eFuse cell is powered up.

Figure 3:
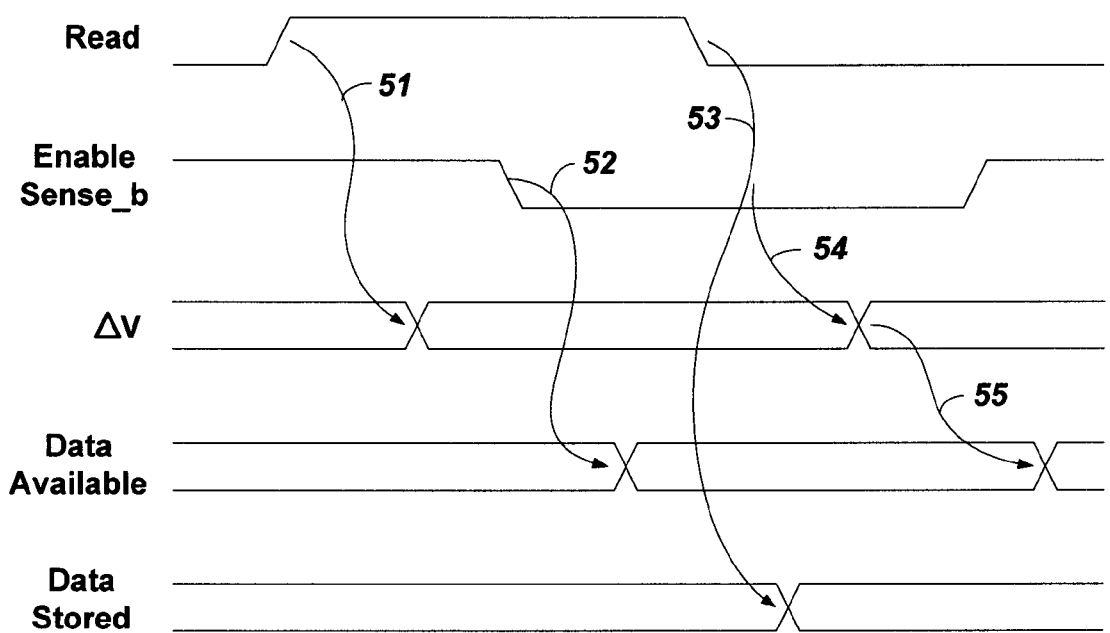
FIG. 3 shows waveforms for a read operation using the circuitry of FIG. 2.

FIG. 3 shows waveforms illustrating a read operation using the circuitry of FIG. 2 and the Enable Sense_b signal. Initially a read signal is applied to enable reading in a high state. The voltage difference between Vref and the voltage on node n3, $\Delta V$, is shown changing states both during the read signal and after the read signal goes back low. The Enable Sense_b is enabled in a low state, as indicated by the "_b", for a period of time. When Read first goes high, $\Delta V$ changes as shown by arrow 51, but neither the Data Available, nor the Data Stored change because Enable Sense_b remains disabled. Once Enable Sense_b is enabled, then the Data Available will transition because the comparator 20 can change states as shown by arrow 52. Data Stored, however, remains unchanged with arrow 52. With arrow 53, the Read signal returns to low, and the latch is triggered with read_b to latch the state of the Data Available as Data Stored. Arrows 53 and 54 show that even though $\Delta V$ and Data Available may change with the comparator 20 disabled with Enable Sense_b, the Data Stored will not change states without Read being toggled to trigger flip-flop 36.

Figure 4:
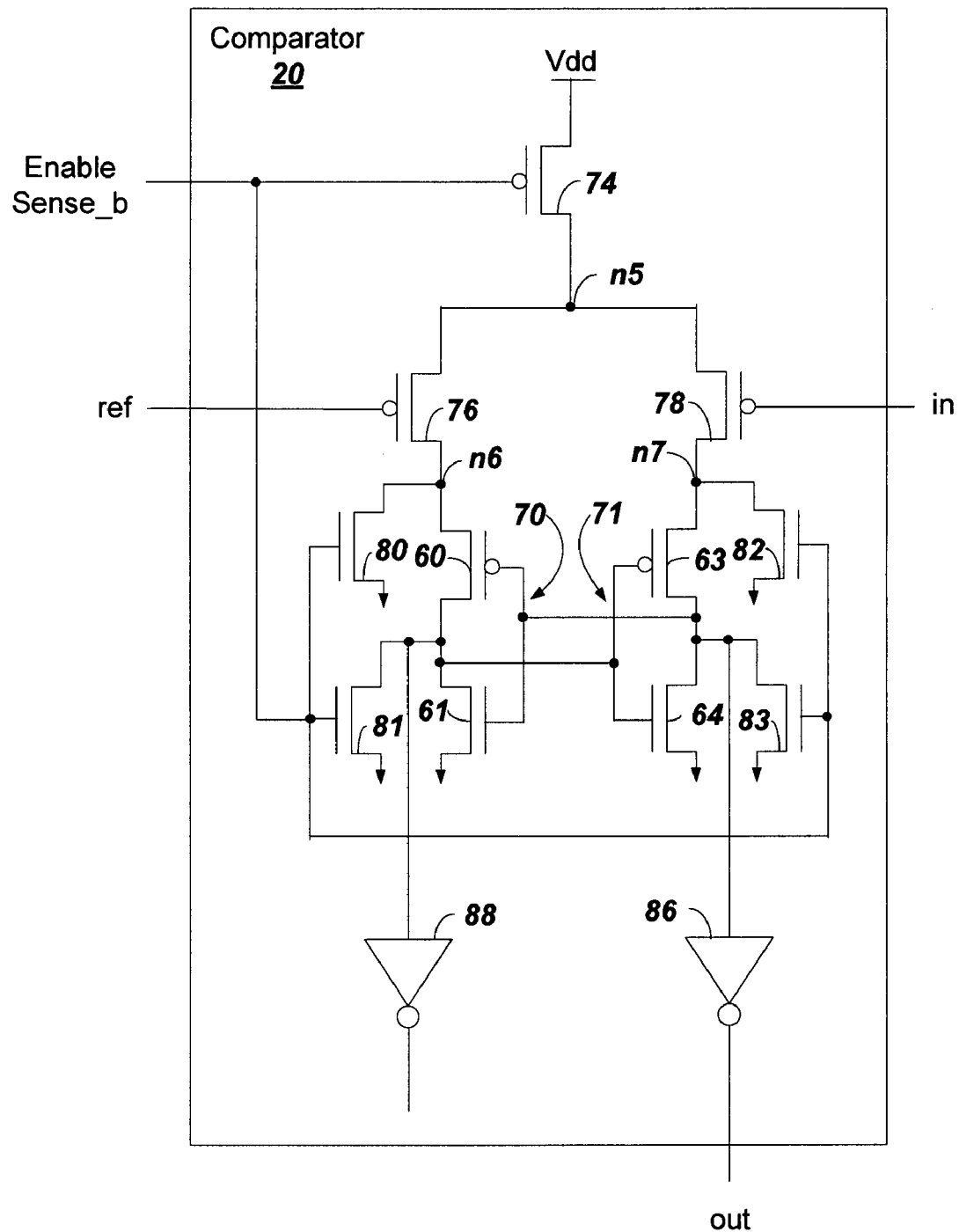
FIG. 4 illustrates an embodiment of circuit components usable in the comparator of FIG. 2.

FIG. 4 shows a circuit implementation of the comparator 20 in accordance with one embodiment of the invention. The circuit initially includes cross coupled inverters 70 and 71. Inverter 70 is made up of PMOS transistor 60 and NMOS transistor 61. Inverter 71 is made up of transistors 63 and 64. Input signal controlled supply switches are formed using PMOS transistors 76 and 78. The PMOS transistors 76 and 78 control power supplied to the respective inverters 70 and 71. Gates of the PMOS transistors 76 and 78 receive the inputs "in" and "ref" of the comparator 20. Inverter 86 connected to the output of inverter 71 provides the output of the comparator 20. An inverter 88 connects to the output of inverter 70, the inverter 88 matching inverter 86 to balance the load between the cross coupled inverters 70 and 71.

The comparator 20 further includes enabling components to initialize the comparator 20 to enable accurate reading of the eFuse state. The PMOS transistor 74 acts as a Vdd supply switch for the entire comparator circuit 20. When not sensing (Enable Sense_b=1), PMOS transistor 74 is off to disconnect Vdd and NMOS transistors 80-83 are on to pull nodes n6 and n7, as well as the outputs of cross coupled inverters 70 and 71 to ground to initialize the inverters 70 and 71. This keeps the two symmetrical halves in an identical state in preparation for sensing the delta voltage across the "ref" and "in" inputs. When Enable Sense_b goes from 1 to 0, PMOS transistor 74 turns on to supply power to node n5.

Depending on the relative voltages on "ref" and "in", either transistor 76 or 78 will be turned on faster than the other, and transistor 74 will supply the voltage Vdd to raise the power supply at the nodes n6 and n7 to Vdd at a different speed, so as to steer the cross coupled inverters 70 and 71 into a certain state. If the voltage on "in" is higher than "ref", node n6 will rise faster. With the gate of transistor 60 initially low, current passes through transistor 60 to turn on transistor 64 and turn off transistor 63. This in turn drives the output of inverter 71 low, maintaining the gate of transistor 60 low and keeping transistor 61 off so that the output of inverter 70 stays high. With the output of inverter 71 low, the inverter 86 will provide a high output. In a similar way, if the voltage on "in" is lower than "ref", the cross-coupled inverter 70 and 71 will produce a low data output through inverter 86.

As previously mentioned, the purpose of NMOS transistors 80-83 is to keep the two symmetrical halves of the comparator circuit 20 in the same state prior to sensing. To do so helps increase the sensitivity of the comparator 20, meaning the circuit will be able to resolve smaller delta voltages across "ref" and "in" into logic 1s and 0s.

Although the present invention has been described above with particularity, this was merely to teach one of ordinary skill in the art how to make and use the invention. Many additional modifications will fall within the scope of the invention, as that scope is defined by the following claims.

What is claimed is:

1. An eFuse circuit, comprising:
   a comparator having a first input and a second input, and further having an output providing a data output indication of the eFuse circuit;

an eFuse cell comprising:
   an eFuse coupled to the first input of the comparator;
   a first transistor having a source-drain path coupling a first terminal of the eFuse to the first input of the comparator, and a gate coupled to receive a read signal;
   a second transistor having a source-drain path coupling the second terminal of the eFuse cell to a ground connection, and a gate coupled to receive the read signal; and
   a third transistor having a source drain path coupling a power supply connection to the first input of the comparator, and having a gate coupled to the second input of the comparator, and
a reference generator circuit comprising:
   a resistor coupled to the second input of the comparator
   a first transistor having a source-drain path coupling a first terminal of the resistor to a second input of the comparator, and a gate coupled to receive the read signal;
   a second transistor having a source-drain path coupling the second terminal of the resistor to the ground connection, and a gate coupled to receive the read signal; and
   a third transistor having a source drain path coupling the power supply connection to the second input of the comparator, and having a gate coupled to the second input of the comparator.

2. The eFuse circuit of claim 1, wherein the first, second and third transistors of the eFuse cell have substantially the same size as the first, second and third transistors, respectively, of the reference generator.

3. The eFuse circuit of claim 1, wherein the eFuse cell further comprises:
   a programmable transistor having a source drain path coupling the first terminal of the eFuse to the ground connection, and having a gate coupled to receive a program signal; and
   a fuse programming connection (Vfs) coupled to the second terminal of the eFuse cell.

4. The eFuse circuit of claim 3, further comprising a flip-flop coupled to an output of the comparator, wherein the flip-flop is clocked by an inverse of the read signal.

5. The eFuse circuit of claim 1, wherein the resistor comprises one of a doped silicon region, a salicide blocked poly device, a diffusion device, and a discrete resistor.

6. The eFuse circuit of claim 1, wherein the comparator comprises:
   a PMOS enabling transistor having a gate coupled to receive an enabling signal, and a source-drain path coupled at the source to a system power supply;
   cross coupled inverters, at least one of the cross coupled inverters having an output providing an output of the comparator;
   a first PMOS switch transistor having a gate receiving the first input to the comparator, and a source-drain path with a source coupled to the drain of the PMOS enabling transistor, and a drain coupled to a power supply connection of a first one of the cross coupled inverters; and
   a second PMOS switch transistor having a gate receiving the second input to the comparator, and a source-drain path with a source coupled to the drain of the PMOS enabling transistor, and a drain coupled to a power supply connection of a second one of the cross coupled inverters.

7. The eFuse circuit of claim 6, wherein the comparator further comprises:
   first NMOS enabling transistors, each of the first NMOS transistors having a source-drain path coupling a source of a PMOS transistor of the cross coupled inverters to a ground connection, and having a gate coupled to receive the enabling signal; and
   second NMOS enabling transistors, each of the second NMOS transistors having a source-drain path coupling a drain of a PMOS transistors of the cross coupled inverters to the ground connection, and having a gate coupled to receive the enabling signal.

8. The eFuse circuit of claim 7, further comprising:
   a first inverter having an input coupled to an output of a first one of the cross coupled inverters, and having an output forming the output of the comparator; and
   a second inverter having an input coupled to an output of a second one of the cross coupled inverters.

9. A method of determining a state of an eFuse cell, the method comprising:
   receiving a first voltage provided from the eFuse cell;
   receiving a second voltage provided from a reference generator circuit containing a resistor; and
   comparing the first and the second voltage to determine the state of the eFuse cell;
   wherein the effuse cell comprises:
      an eFuse coupled to the first input of the comparator;
      a first transistor having a source-drain path coupling a first terminal of the eFuse to the first input of the comparator, and a gate coupled to receive a read signal;
      a second transistor having a source-drain path coupling the second terminal of the eFuse cell to a ground connection, and a gate coupled to receive the read signal; and
      a third transistor having a source drain path coupling a power supply connection to the first input of the comparator, and having a gate coupled to the second input of the comparator, and
   wherein the reference generator circuit comprises:
      a first transistor having a source-drain coupling a first terminal of the resistor to a second input of the comparator, and a gate coupled to receive the read signal;
      a second transistor having a source-drain path coupling the second terminal of the resistor to the ground connection, and a gate coupled to receive the read signal; and
      a third transistor having a source drain path coupling the power supple connection to the second input of the comparator, and having a gate coupled to the second input of the comparator.

10. The method of claim 9, further comprising:
asserting an enabling signal prior to the step of comparing, and
storing the state of the eFuse cell determined in the comparing step and then deasserting the enabling signal.

11. An eFuse circuit, comprising:
an eFuse cell including an eFuse;
a reference circuit; and
a comparator comprising:
   cross coupled inverters, at least one of the cross coupled inverters having an output providing an output of the comparator;
   a first switch transistor having a gate coupled to the eFuse cell of the comparator, and a source-drain path with a first terminal coupled to a power supply terminal, and a second terminal coupled to a power supply connection of a first one of the cross coupled inverters; and a second switch transistor having a gate coupled to the reference circuit, and a source-drain path with a first terminal coupled to the power supply terminal, and a second terminal coupled to a power supply connection of a second one of the cross coupled inverters, wherein;

the effuse cell comprises:
   an eFuse coupled to the first input of the comparator;
   a first transistor having a source-drain path coupling a first terminal of the eFuse to the first input of the comparator, and a gate coupled to receive a read signal;
   a second transistor having a source-drain path coupling the second terminal of the eFuse cell to a ground connection, and a gate coupled to receive the read signal; and
   a third transistor having a source drain path coupling a power supply connection to the first input of the comparator, and having a gate coupled to the second input of the comparator, and wherein the reference generator circuit comprises:
   a first transistor having a source-drain coupling a first terminal of the resistor to a second input of the comparator, and a gate coupled to receive the read signal;
   a second transistor having a source-drain path coupling the second terminal of the resistor to the ground connection, and a gate coupled to receive the read signal; and
   a third transistor having a source drain path coupling the power supply connection to the second input of the comparator, and having a gate coupled to the second input of the comparator.

12. The eFuse circuit of claim 11, wherein the comparator comprises:
   a PMOS enabling transistor having a gate coupled to receive an enabling signal, and a source-drain path coupling a system power supply to the power supply terminal.

13. The eFuse circuit of claim 11, wherein the first and second switch transistors are PMOS transistors, and wherein the comparator further comprises:
   first NMOS enabling transistors, each of the first NMOS transistors having a source-drain path coupling a source of a PMOS transistor of the cross coupled inverters to a ground connection, and having a gate coupled to receive the enabling signal; and
   second NMOS enabling transistors, each of the second NMOS transistors having a source-drain path coupling a drain of a PMOS transistors of the cross coupled inverters to the ground connection, and having a gate coupled to receive the enabling signal.

14. The eFuse circuit of claim 11, further comprising:
   a first inverter having an input coupled to an output of a first one of the cross coupled inverters, and having an output forming the output of the comparator; and
   a second inverter having an input coupled to an output of a second one of the cross coupled inverters.

* * * * *

UNITED STATES PATENT AND TRADEMARK OFFICE
CERTIFICATE OF CORRECTION

PATENT NO. : 7,501,879 B1  Page 1 of 1
APPLICATION NO. : 11/717836
DATED : March 10, 2009
INVENTOR(S) : Oh et al.

It is certified that error appears in the above-identified patent and that said Letters Patent is hereby corrected as shown below:

Claim 9, col. 6, line 26, "effuse" should read -- eFuse --.

Claim 11, col. 7, line 10, "effuse" should read -- eFuse --.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,501,879 B1  Page 1 of 1
APPLICATION NO. : 11/717836
DATED : March 10, 2009
INVENTOR(S) : Oh et al.

It is certified that error appears in the above-identified patent and that said Letters Patent is hereby corrected as shown below:

Title Page:

Section [75], Please add; Shidong Zhou

Signed and Sealed this

Twenty-eighth Day of September, 2010

David J. Kappos
*Director of the United States Patent and Trademark Office*